United States Patent
Liu et al.

(10) Patent No.: US 7,227,305 B2
(45) Date of Patent: Jun. 5, 2007

(54) STACKED ORGANIC ELECTROLUMINESCENT DEVICES

(75) Inventors: Jie Liu, Niskayuna, NY (US); Joseph John Shiang, Niskayuna, NY (US); Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 319 days.

(21) Appl. No.: 10/870,865

(22) Filed: Jun. 18, 2004

(65) Prior Publication Data

US 2005/0280359 A1    Dec. 22, 2005

(51) Int. Cl.
*H01L 51/00* (2006.01)
*G09G 3/30* (2006.01)

(52) U.S. Cl. .................. 313/506; 313/504; 315/169.1; 315/169.3

(58) Field of Classification Search ............... 313/504, 313/506; 257/98, 99; 428/690, 917; 315/169.1, 315/169.3
See application file for complete search history.

(56) References Cited

U.S. PATENT DOCUMENTS

| | | | |
|---|---|---|---|
| 5,677,572 A | 10/1997 | Hung et al. | |
| 5,837,391 A | 11/1998 | Utsugi | |
| 5,917,280 A | 6/1999 | Burrows et al. | |
| 5,965,907 A * | 10/1999 | Huang et al. | 257/89 |
| 5,998,803 A | 12/1999 | Forrest et al. | |
| 6,023,371 A | 2/2000 | Onitsuka et al. | |
| 6,107,734 A | 8/2000 | Tanaka et al. | |
| 6,566,806 B1 | 5/2003 | Kawai | |
| 7,012,364 B2 * | 3/2006 | Mori et al. | 313/504 |
| 2004/0031957 A1 | 2/2004 | Close et al. | |

OTHER PUBLICATIONS

"Near-ultraviolet Electroluminescence from Polysilanes", Suzuki et al., Thin Solid Films 331, (1998), pp. 64-70.
PCT/US2005/011755 International Search Report and Written Opinion.
U. Mitschke et al., "The Electroluminescence of Organic Materials", J. Mater. Chem., vol. 10, 1471-1507 (2000).
H. Suzuki et al., "Near-Ultraviolet Electroluminescence from Polysilanes", Thin Sol. Films, vol. 331, 64-70 (1998).
G. Gu et al., "Transparent Stacked ORganic Light Emitting Devices, II. Device Performance and Applications to Displays", J. Appl. Physc., vol. 86, No. 8, 4076 (1999).
R. H. Friends, "Optical Investigations of Conjugated Polymers", J. Mol. Electronics, vol. 4, 37-46 (1988).

* cited by examiner

*Primary Examiner*—Karabi Guharay
(74) *Attorney, Agent, or Firm*—Mary Louise Gioeni; William E. Powell, III

(57) ABSTRACT

A light-emitting device comprises a stack of organic electroluminescent (EL) elements, wherein an organic EL element in the stack overlaps at least a portion of another organic EL element, and the organic EL elements are electrically separate. Each of the organic EL elements of the stack is activated with a different level of voltage.

13 Claims, 5 Drawing Sheets

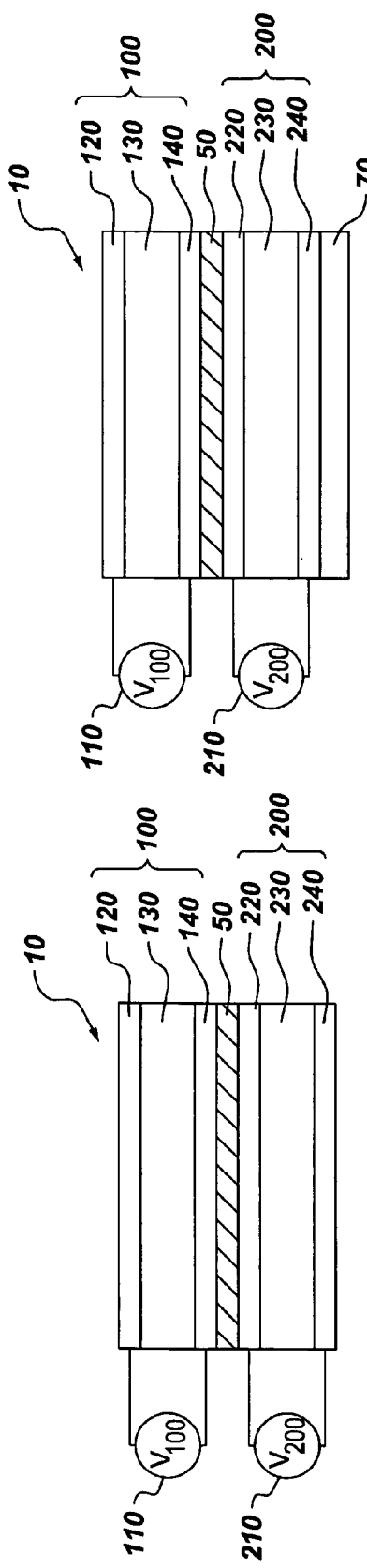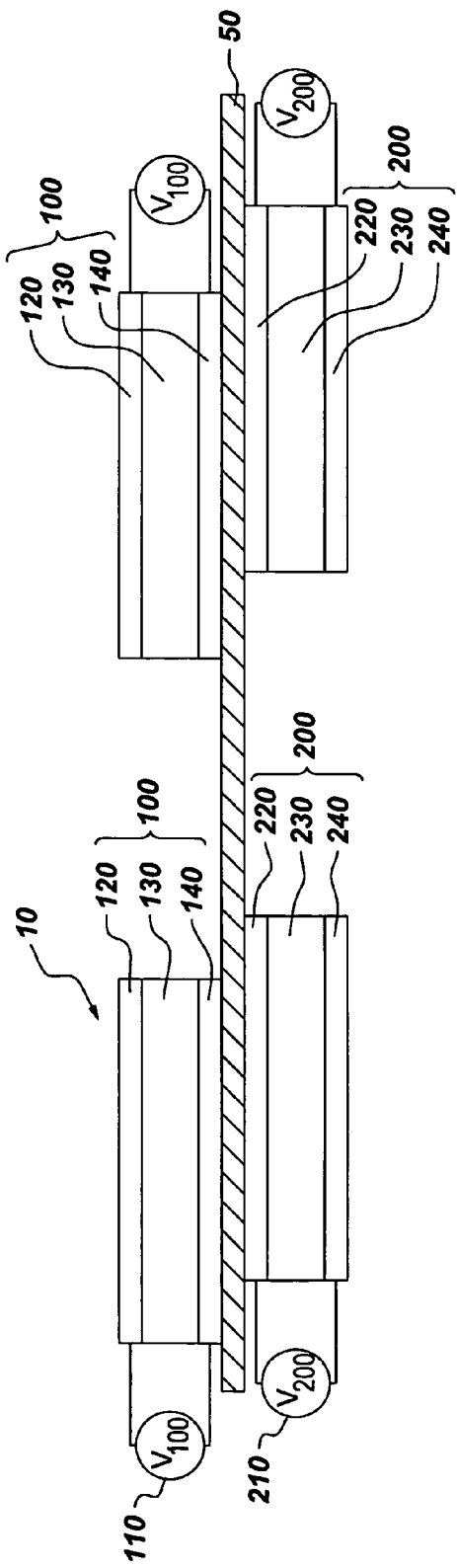
Fig. 1
Fig. 2
Fig. 3

_US 7,227,305 B2_

STACKED ORGANIC ELECTROLUMINESCENT DEVICES

BACKGROUND OF THE INVENTION

The present invention relates to organic electroluminescent devices ("OELDs"). In particular, the present invention relates to such devices having a plurality of electroluminescent elements arranged in a stack.

Electroluminescent ("EL") devices, which convert electrical energy to electromagnetic energy, may be classified as either organic or inorganic and are well known in graphic display and imaging art. EL devices have been produced in different shapes for many applications. Inorganic EL devices comprising inorganic semiconducting materials have gained acceptance in many applications in recent years. However, they typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent organic semiconductor layers are sandwiched between a cathode and an anode. The organic semiconductor layers may be either hole (positive charge)-injecting or electron (negative charge)-injecting layers and also comprise organic materials. The material for the light-emitting layer may be selected from many organic EL materials that emit light having different wavelengths. The light-emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometers. Although OELDs now require relatively low activation voltages, the continuous activation of these devices still contributes to limit their longevity.

Therefore, their still is a need to provide OELDs having longer life. Moreover, it is very desirable to provide light sources comprising OELDs that have longer life but do not suffer from diminished illuminating capacity.

BRIEF SUMMARY OF THE INVENTION

In general, the present invention provides a light-emitting device that comprises a plurality of organic EL elements arranged in a stack, wherein one organic EL element overlaps at least a portion of another organic EL element.

In one aspect of the present invention, the organic EL elements are electrically separate from each other. Each of such organic EL elements comprises an organic EL material disposed between a pair of electrodes.

In another aspect of the present invention, each organic EL element is provided with a different activation voltage.

In still another aspect of the present invention, a method for making a light-emitting device comprises disposing a plurality of organic EL elements arranged in a stack such that one organic EL element overlaps at least a portion of another organic EL element.

Other features and advantages of the present invention will be apparent from a perusal of the following detailed description of the invention and the accompanying drawings in which the same numerals refer to like elements.

BRIEF DESCRIPTION OF THE DRAWINGS

FIG. 1 shows schematically a first embodiment of a light-emitting device of the present invention.

FIG. 2 shows schematically another embodiment of a light-emitting device of the present invention, wherein a portion of one light-emitting element overlaps a portion of another light-emitting element.

FIG. 3 shows schematically a light-emitting device of the present invention disposed on a substrate.

DETAILED DESCRIPTION OF THE INVENTION

Figure 5:
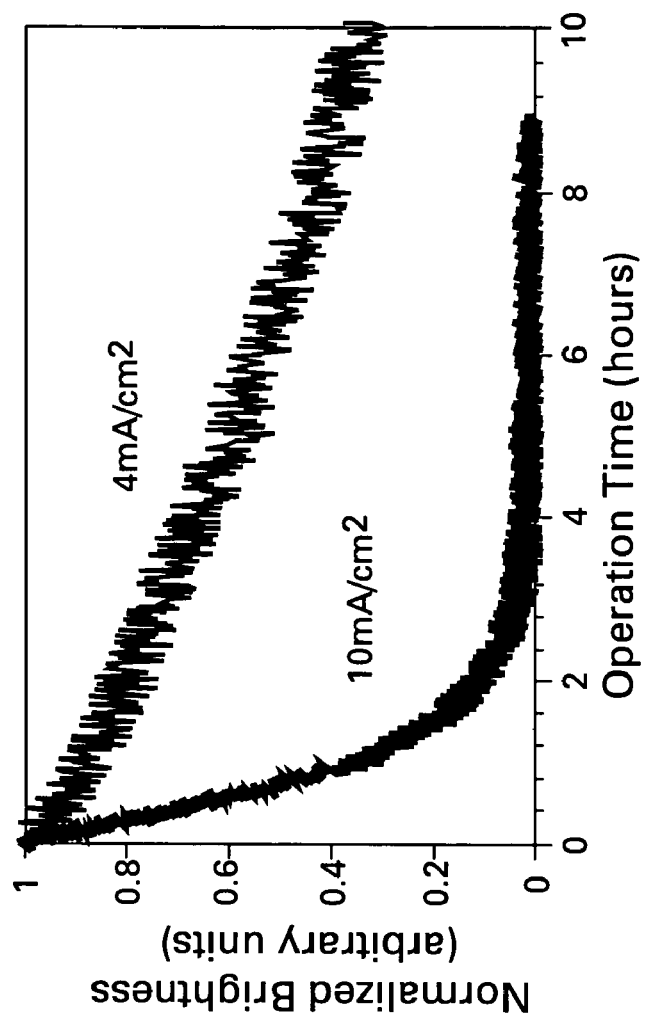
FIG. 5 shows the life time of two devices operated at different current densities.

In general, the present invention provides a light-emitting device that comprises a plurality of organic EL elements arranged in a stack, wherein one organic EL element overlaps at least a portion of another organic EL element. The light-emitting device provides substantially similar illuminating capacity as prior-art OELDs but requires lower activation voltages. The term "electroluminescent device," as used herein, means a device that converts electrical energy, either alone or in conjunction with another form of energy, to electromagnetic energy. For example, an electroluminescent device can be, but are not limited to, a light-emitting diode or a light-emitting electrochemical cell.

FIG. 1 shows schematically a light-emitting device 10 of the present invention. Light-emitting device 10 comprises organic EL elements 100 and 200 arranged in a stack and separated by an electrically insulating material 50, wherein at least a portion of organic EL element 100 overlaps at least a portion of organic EL element 200. Organic EL element 100 comprises a first organic EL material 130 disposed between first electrode 120 and second electrode 140. Similarly, organic EL element 200 comprises a second organic EL material 230 disposed between first electrode 220 and second electrode 240. Insulating material 50 comprises a substantially transparent material, such as a glass or a substantially transparent plastic material. Organic EL elements 100 and 200 are provided with power supplies 110 and 210, respectively. In one embodiment, voltages $V_{100}$ and $V_{200}$ supplied to organic EL elements 100 and 200 have different values, which are chosen to generate a desired brightness from the combined light-emitting device 10. Thus, each of voltages $V_{100}$ and $V_{200}$ can be chosen independently such that one organic EL material (130 or 230) is not exposed to a relatively higher voltage level that may be required by another EL material. In another embodiment, power supplies 110 and 210 provide currents of different values to organic elements 100 and 200. Although FIG. 1 shows two organic EL elements 100 and 200, it should be understood that more than two organic EL elements may be included in a light-emitting device 10 of the present invention. In one embodiment, first electrodes 120 and 220 are anodes, and second electrodes 140 and 240 are cathodes. In another embodiment, the order of the first and second electrodes in one organic EL element may be reversed.

In another embodiment, light-emitting device 10 is disposed on a substrate 70, as shown in FIG. 3. Substrate 70 may comprise glass or a substantially transparent plastic material.

In one embodiment, organic EL materials 130 and 230 comprise the same material. In another embodiment, organic EL materials 130 and 230 comprise different materials. For example, each EL material can emit in a different wavelength range.

In still another embodiment, a light-emitting device comprising three organic EL elements arranged in a stack, emitting in the blue, green, and red wavelength ranges separately. For example, each organic EL element can emit substantially in a wavelength range selected from the group consisting of 400–480 nm, 480–580 nm, and 580–700 nm. Thus, such a light-emitting device can provide white light from the mixture of light from the individual EL elements.

Figure 4:
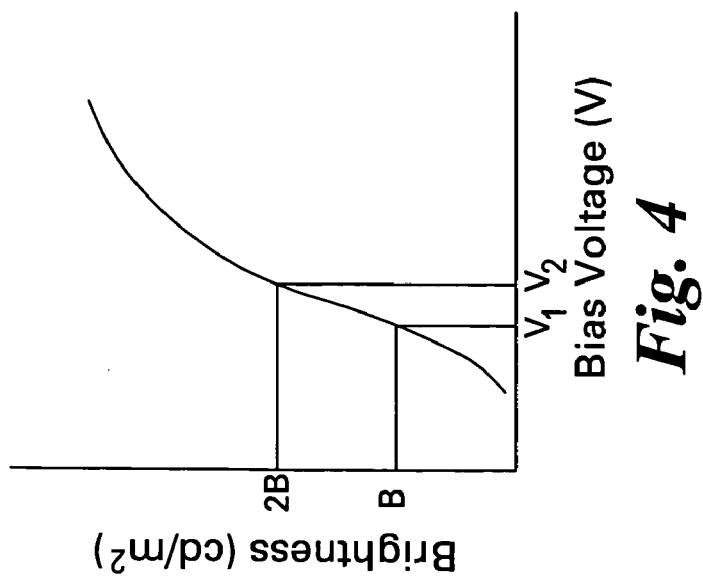
FIG. 4 shows brightness versus bias voltage for a typical organic EL element.

The brightness of an organic EL material typically increases monotonically with applied voltage within a reasonable voltage range, as shown in FIG. 4. Thus, in one embodiment of the present invention, a plurality of organic EL elements that are arranged in a stack and each activated at a low voltage can provide a total brightness that is substantially the same as that provided by a single organic EL element activated at a much higher voltage. Operating organic EL elements at a lower voltage (or current density) in the present invention results in a longer life of the EL elements, as is illustrated in FIG. 5 for a blue light-emitting polymer. For example, light-emitting device 10 comprising two substantially identical organic EL elements which are arranged in a stack and each of which is operated at bias voltage $V_1$ can provide the same total brightness of 2B as a single organic EL element that must be operated at bias voltage $V_2 > V_1$ (see FIG. 4).

The components of an organic EL element are now described in detail.

The anode 120 (or 220) of organic EL element 100 (or 200) comprises a material having a high work function; e.g., greater than about 4.4 eV, for example from about 5 eV to about 7 eV. Indium tin oxide ("ITO") is typically used for this purpose. ITO is substantially transparent to light transmission and allows light emitted from organic EL layer 130 (or 230) easily to escape through the ITO anode layer without being seriously attenuated. The term "substantially transparent" means allowing at least 50 percent, preferably at least 80 percent, and more preferably at least 90 percent, of light in the visible wavelength range transmitted through a film having a thickness of about 0.5 micrometer, at an incident angle of less than or equal to 10 degrees. Other materials suitable for use as the anode layer are tin oxide, indium oxide, zinc oxide, indium zinc oxide, zinc indium tin oxide, antimony oxide, and mixtures thereof. Still other usable materials for anode layer 120 are carbon nanotubes, or metals, such as silver or gold. Anode layer 120 may be deposited on the underlying element by physical vapor deposition, chemical vapor deposition, or sputtering. The thickness of an anode comprising such an electrically conducting oxide can be in the range from about 10 nm to about 500 nm, preferably from about 10 nm to about 200 nm, and more preferably from about 50 nm to about 200 nm. A thin, substantially transparent layer of a metal is also suitable; for example, a layer having a thickness less than about 50 nm, preferably less than about 20 nm. Suitable metals for anode 120 are those having high work function, such as greater than about 4.4 eV, for example, silver, copper, tungsten, nickel, cobalt, iron, selenium, germanium, gold, platinum, aluminum, or mixtures thereof or alloys thereof. In one embodiment, it may be desirable to dispose anode 120 on a substantially transparent substrate, such as one comprising glass or a polymeric material.

Cathode 140 (or 240) injecting negative charge carriers (electrons) into organic EL layer 130 (or 230) and is made of a material having a low work function; e.g., less than about 4 eV. Low-work function materials suitable for use as a cathode are K, Li, Na, Mg, Ca, Sr, Ba, Al, Ag, Au, In, Sn, Zn, Zr, Sc, Y, elements of the lanthanide series, alloys thereof, or mixtures thereof. Suitable alloy materials for the manufacture of cathode layer 140 are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, KF, or NaF, covered by a thicker layer of some other metal, such as aluminum or silver. Cathode 140 may be deposited on the underlying element by physical vapor deposition, chemical vapor deposition, or sputtering. The Applicants unexpectedly discovered that an electron-donating material chosen from among those disclosed above lowered the work function of cathode materials, thus reducing the barrier for electron injection and/or transport into organic EL material 130. Preferably, cathode 140 (or 240) is substantially transparent. In some circumstances, it may be desirable to provide a substantially transparent cathode that is made of a material selected from the group consisting of ITO, tin oxide, indium oxide, zinc oxide, indium zinc oxide, zinc indium tin oxide, antimony oxide, and mixtures thereof. Materials such as carbon nanotubes may also be used as cathode material.

Organic EL layer 130 (or 230) serves as the transport medium for both holes and electrons. In this layer these excited species combine and drop to a lower energy level, concurrently emitting EM radiation in the visible range. Organic EL materials are chosen to electroluminesce in the desired wavelength range. The thickness of the organic EL layer 130 is preferably kept in the range of about 100 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable EL polymers are poly(N-vinylcarbazole) ("PVK", emitting violet-to-blue light in the wavelengths of about 380–500 nm) and its derivatives; polyfluorene and its derivatives such as poly(alkylfluorene), for example poly(9, 9-dihexylfluorene) (410–550 nm), poly(dioctylfluorene) (wavelength at peak EL emission of 436 nm) or poly{9,9-bis(3,6-dioxaheptyl)-fluorene-2,7-diyl} (400–550 nm); poly (praraphenylene) ("PPP") and its derivatives such as poly (2-decyloxy-1,4-phenylene) (400–550 nm) or poly(2,5-diheptyl-1,4-phenylene); poly(p-phenylene vinylene)

("PPV") and its derivatives such as dialkoxy-substituted PPV and cyano-substituted PPV; polythiophene and its derivatives such as poly(3-alkylthiophene), poly(4,4'-dialkyl-2,2'-biothiophene), poly(2,5-thienylene vinylene); poly(pyridine vinylene) and its derivatives; polyquinoxaline and its derivatives; and poly quinoline and its derivatives. Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane} which are disclosed in H. Suzuki et al., "Near-Ultraviolet Electroluminescence From Polysilanes," Thin Solid Films, Vol. 331, 64–70 (1998). These polysilanes emit light having wavelengths in the range from about 320 nm to about 420 nm.

Organic materials having molecular weight less than, for example, about 5000 that are made of a large number of aromatic units are also applicable. An example of such materials is 1,3,5-tris{n-(4-diphenylaminophenyl) phenylamino}benzene, which emits light in the wavelength range of 380–500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis{2,6-di(t-butyl)phenoxide} or scandium-(4-methoxy-picolylmethylketone)-bis(acetylacetonate), which emits in the range of 420–433 nm. For white light application, the preferred organic EL materials are those emit light in the blue-green wavelengths.

Other suitable organic EL materials that emit in the visible wavelength range are organo-metallic complexes of 8-hydroxyquinoline, such as tris(8-quinolinolato)aluminum and its derivatives. Other non-limiting examples of organic EL materials are disclosed in U. Mitschke and P. Bauerle, "The Electroluminescence of Organic Materials," J. Mater. Chem., Vol. 10, pp. 1471–1507 (2000).

An organic EL material is deposited on the underlying layer (e.g., an electrode layer) by physical or chemical vapor deposition, spin coating, dip coating, spraying, ink-jet printing, gravure coating, flexo-coating, screen printing, or casting, followed by polymerization, if necessary, or curing of the material. The organic EL material may be diluted in a solvent to adjust its viscosity or mixed with another polymeric material that serves as a film-forming vehicle.

Figure 6:
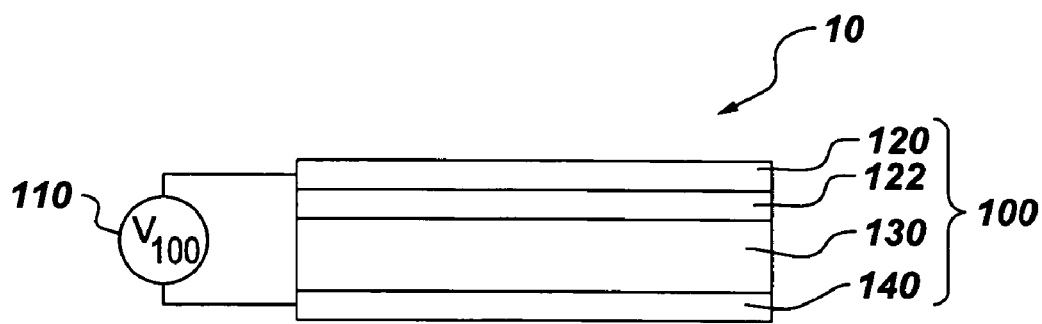
FIG. 6 shows schematically an organic EL element that includes a hole injection enhancement layer.

Furthermore, one or more additional layers may be included in light-emitting element 100 further to increase the efficiency thereof. For example, an additional layer can serve to improve the injection and/or transport of positive charges (holes) into the organic EL layer 130. The thickness of each of these layers is kept to below 500 nm, preferably below 100 nm. Suitable materials for these additional layers are low-to-intermediate molecular weight (for example, less than about 2000) organic molecules, poly(3,4-ethylenedioxythipohene) ("PEDOT"), and polyaniline. They may be applied during the manufacture of the element 100 by conventional methods such as spray coating, dip coating, gravure coating, flexo-coating, screen printing, or physical or chemical vapor deposition. In one embodiment of the present invention, as shown in FIG. 6, a hole injection enhancement layer 122 is formed between the anode layer 120 and the organic EL layer 130 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetra-carboxylic dianhydride or bis(1,2,5-thiadiazolo)-p-quinobis(1,3-dithiole).

Figure 7:
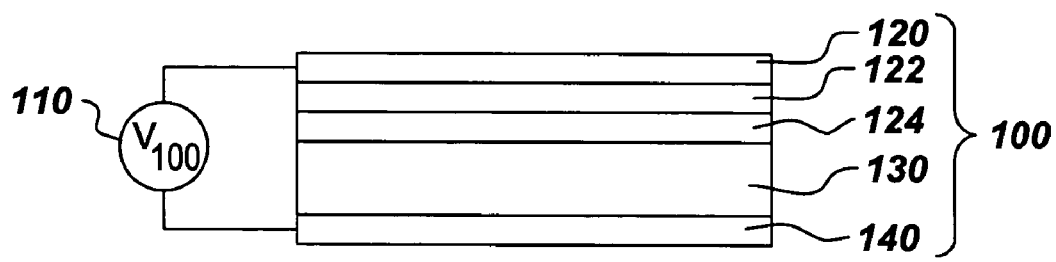
FIG. 7 shows schematically an organic EL element that includes a hole injection enhancement layer and a hole transporting layer.

FIG. 7, light-emitting device 10 further includes a hole transport layer 124 which is disposed between the hole injection enhancement layer 122 and the organic EL layer 130. The hole transport layer 124 has the functions of transporting holes and blocking the transportation of electrons so that holes and electrons are optimally combined in the organic EL layer 130. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Figure 8:
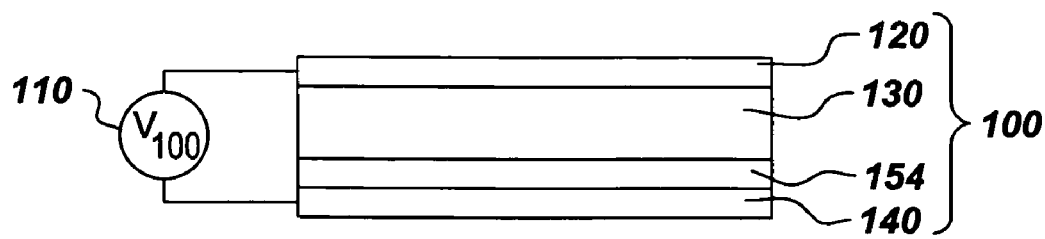
FIG. 8 shows schematically an organic EL element that includes an electron injecting and transporting enhancement layer.

In still another embodiment of the present invention, as shown schematically in FIG. 8, light-emitting element 100 includes an additional layer 154 which can be disposed between cathode 140 and organic EL layer 130. Layer 154 can further enhance the injection and transport of electrons (hereinafter called "electron injecting and transporting enhancement layer") to organic EL layer 130. Materials suitable for the electron injecting and transporting enhancement layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

EXAMPLE

Fabrication of Organic EL Elements

Organic EL elements were fabricated. Each includes an organic EL polymer emitting blue, green, or red light. The organic EL polymers were purchased from American Dye Source, Inc. (Baie d'Urfe, Quebec, Canada), having catalog numbers ADS329BE (blue light-emitting), ADS132GE (green light-emitting), and ADS200RE (red light-emitting). ADS329BE is poly(9,9-dioctylfluorenyl-2,7-diyl) end capped with N,N'-bis(4-methylphenyl-4-aniline). ADS132GE is poly(9,9-dioctylfluorenyl-2,7-diyl)-alt-co-(N,N'-diphenyl)-N,N'-di(p-butyl-oxyphenyl)-1,4-diaminobenzene. ADS200RE is poly{2-methoxy-5-(2-ethylhexyloxy)-1,4-phenylenevinylene} end capped with polyhedral oligomeric silsesquioxanes.

Figure 9:
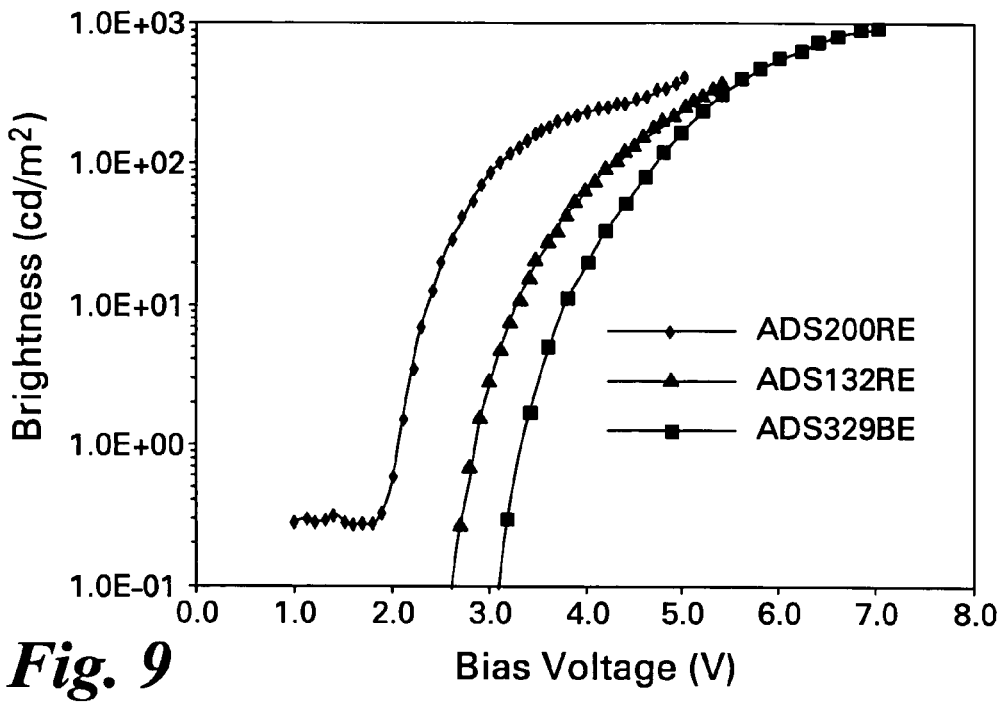
FIG. 9 shows brightness as a function of bias voltage for three organic EL elements emitting three different colors.
Figure 10:
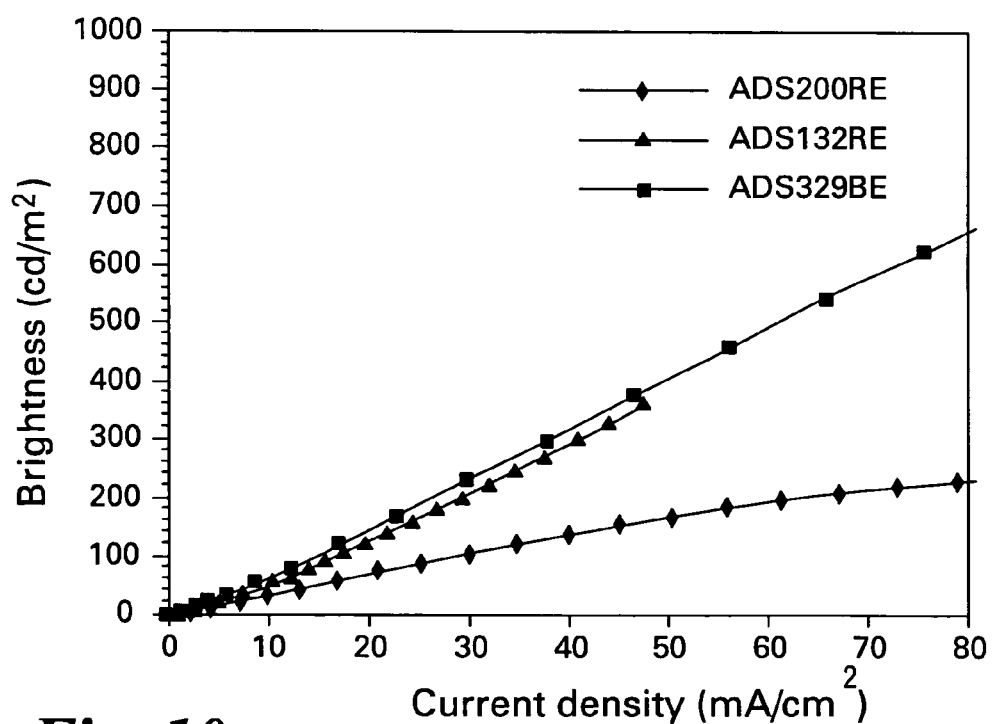
FIG. 10 shows brightness as a function of current density for three organic EL elements emitting three different colors.

An Organic EL Element was Fabricated as Follows:

A glass substrate that was precoated with ITO was purchased from Applied Films, Longmont, Colorado, and then cleaned with ultraviolet radiation and ozone. A layer of poly(3,4-ethylenedioxythiophene)/polystyrene sulfonate (PEDOT/PSS) having a thickness of about 60 nm was deposited by spin coating on the ITO side of the cleaned ITO-coated glass, and baked for one hour at about 170 C in ambient atmosphere. The coated piece was then transferred into a controlled atmosphere glove box (moisture and oxygen levels less than 1 ppm). A layer of the chosen organic EL polymer having a thickness of about 80 nm was deposited by spin coating on the PEDOT/PSS layer. A layer of NaF having a thickness of about 4 nm was vapor deposited, at a vacuum of about $2\times10^{-6}$ mm Hg, on the polymer layer. Then a layer of aluminum having a thickness of about 120 nm was similarly vapor deposited on the NaF layer. Then the entire multilayer ensemble was encapsulated with a glass slide and sealed with epoxy. Brightness of each organic EL element as a function of bias voltage and current density are shown in FIGS. 8 and 9. It can be seen that individual organic EL elements can be operated independently at different bias voltage to achieve a desired brightness. Thus, by arranging the organic EL elements in a stack and operating them independently, some elements are not exposed unnecessarily to higher bias voltages, resulting in their longer lives.

Stacking a plurality of organic EL elements also provides a benefit of producing a more uniform brightness because the brightness nonuniformity of one organic EL element can be mitigated by another organic EL element in the stack. This situation occurs, for example, when a pair of electrodes is disposed in contact with the two opposite edges of a sheet of an organic EL material. Since the sheet of most transparent conductors/electrodes has a finite resistance, the brightness of the EL element decreases continuously from anode to cathode. To mitigate this decrease in brightness, a second organic EL element of the same construction is disposed on the first organic EL element such that the direction of current flow in the second element is opposite to that in the first element. This arrangement produces a more uniform brightness from the total device.

Figure 11:
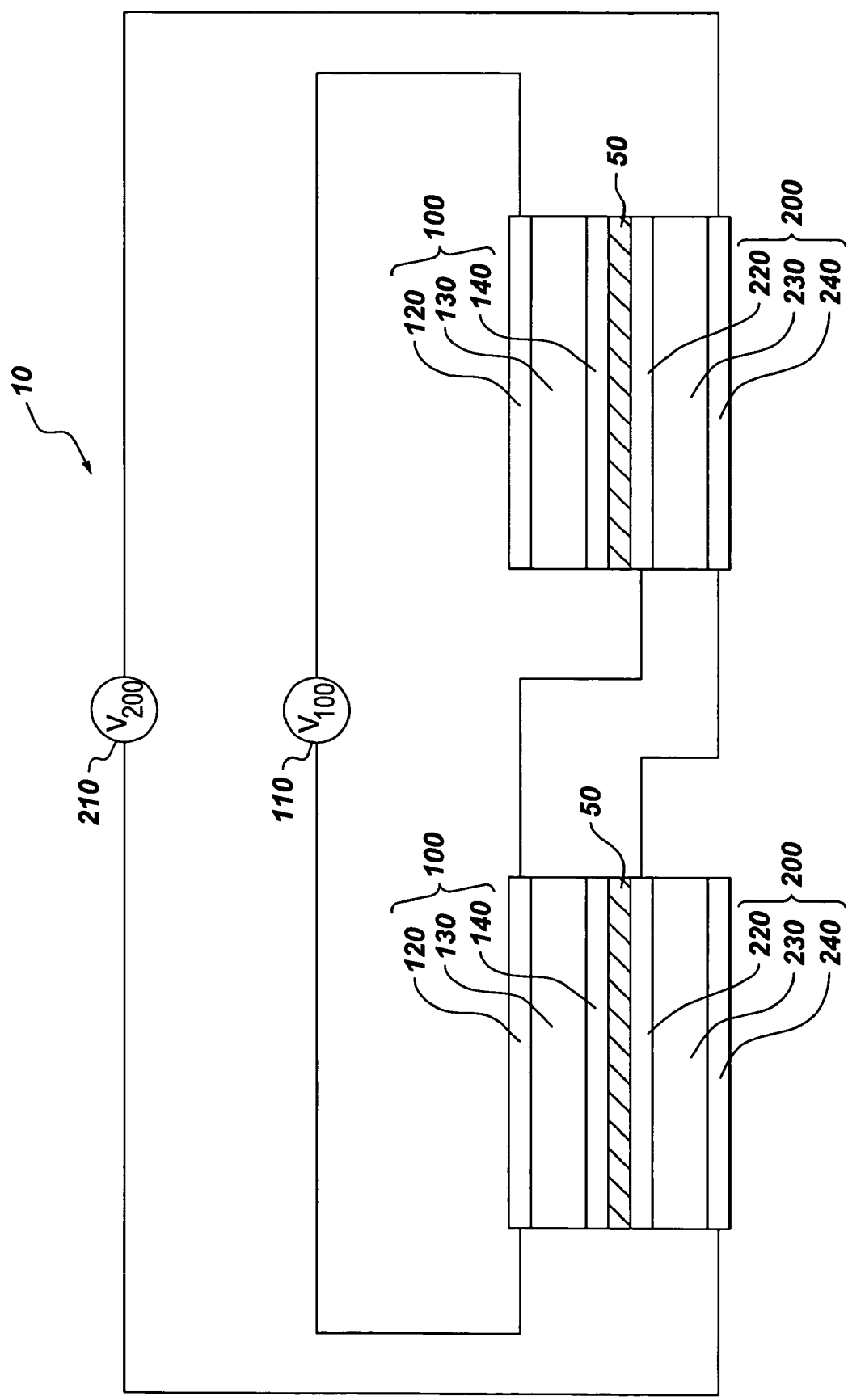
FIG. 11 shows schematically stacks of organic EL elements, wherein one element of one stack is connected electrically in series to another element of a different stack.

In one embodiment, at least two stacks of organic EL elements are disposed adjacent to one another. The organic EL elements in a single stack are electrically separate, but organic EL elements of adjacent stacks, one from each stack, are electrically connected in series, as shown in FIG. 11. Each of such series is independently controlled such that only a voltage desired for such series is imposed thereon. Although FIG. 11 shows two stacks of organic EL elements, each having two elements, the present invention is equally applicable to any number of stacks, each having any number of elements greater than at least two.

In one embodiment, the organic EL materials of the organic EL elements of a single stack comprise different materials. Furthermore, they can emit different light colors. In another embodiment, the organic EL materials of organic EL elements that are connected electrically in-series comprise the same material, while the organic EL materials of the organic EL elements of a single stack comprise different materials.

In another aspect of the present invention, a method of making a light-emitting device comprises disposing a plurality of organic EL elements in a stack such that one organic EL element of the stack overlaps with at least a portion of another organic EL element of the stack and such that the organic EL elements are electrically separate, wherein each organic EL element comprises an organic EL material disposed between a pair of electrodes.

In still another aspect, a method of making a light-emitting device comprises: (a) providing a substrate; (b) disposing a first organic EL element on the substrate; (c) disposing an electrically non-conducting material on the first organic EL element; (d) disposing a second organic EL element on the electrically non-conducting material; wherein each organic EL element comprises an organic EL material sandwiched between a first electrode and a second electrode, and the electrically non-conducting material electrically separates the first and second organic EL elements.

In still another aspect, the step of disposing an organic EL element comprises: (1) disposing a first electrically conducting material on an underlying layer; (2) disposing an organic EL material on the first electrically conducting material; and (3) disposing a second electrically conducting material on the organic EL material.

In still another aspect, the step of disposing an electrically conducting material is effected by a method selected from the group consisting of physical vapor deposition, chemical vapor deposition, and sputtering. The step of disposing an organic EL material is effected by a method selected from the group consisting of physical vapor deposition, chemical vapor deposition, spin coating, dip coating, spraying, ink-jet printing, and casting. The step of disposing is followed by polymerization, if necessary, or curing of the organic EL material.

In still another aspect, a method of generating light comprises providing an independent voltage to each organic EL element of a stack of organic EL elements, wherein one organic EL element of the stack overlaps with at least a portion of another organic EL element of the stack, the organic EL elements are electrically separate, and each organic EL element comprises an organic EL material disposed between a pair of electrodes.

In still another aspect of the method of the present invention, the voltage applied to an organic EL element is different from that applied to another organic EL element.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A light-emitting device comprises a plurality of stacks of organic EL elements, wherein one organic EL element of a stack overlaps at least a portion of another organic EL element of the same stack, the organic EL elements of the same stack are electrically separate, one organic EL element of one stack is electrically connected in series to another organic EL element in an adjacent stack, and each organic EL element comprises an organic EL material disposed between a pair of electrodes.

2. The light emitting device of claim 1 wherein each series of organic EL elements is activated with a different current level.

3. The light-emitting device of claim 1, wherein one of the electrode comprises a material selected from the group consisting of indium tin oxide, tin oxide, indium oxide, zinc oxide, indium zinc oxide, zinc indium tin oxide, antimony oxide, carbon nanotubes, silver, gold, and mixtures thereof.

4. The light-emitting device of claim 1, wherein one of the electrode is a cathode and comprises a material selected from the group consisting of K, Li, Na, Mg, Ca, Sr, Ba, Al, Ag, Au, In, Sn, Zn, Zr, Sc, Y, elements of the lanthanide series, alloys thereof, mixtures thereof, Ag—Mg alloy, Al—Li alloy, In—Mg alloy, Al—Ca alloy, LiF, KF, and NaF.

5. The light-emitting device of claim 1, wherein one of the electrode is a cathode and comprises a material selected from the group consisting of indium tin oxide, tin oxide, indium oxide, zinc oxide, indium zinc oxide, zinc indium tin oxide, antimony oxide, carbon nanotubes, and mixtures thereof.

6. The light-emitting device of claim 5, wherein the cathode is a layer having a thickness from about 1 nm to about 10 nm.

7. The light-emitting device of claim 1, wherein the organic EL material comprises a material selected from the group consisting of poly(n-vinylcarbazole); polyfluorene; poly(alkylfluorene); poly(praraphenylene); poly(p-phenylene vinylene); polythiophene; poly(pyridine vinylene); polyquinoxaline; poly(quinoline); and derivatives thereof.

8. The light-emitting device of claim 1, wherein the organic EL material comprises polysilane.

9. The light-emitting device of claim 8, wherein the polysilane is selected from the group consisting of poly(di-n-butylsilane), poly(di-n-pentylsilane), poly(di-n-hexylsilane), poly(methylphenylsilane), and poly{bis(p-butylphenyl)silane}.

10. The light-emitting device of claim 1, wherein the organic EL material comprises a material selected from the group consisting of organo-metallic complexes of 8-hydroxyquinoline, aluminum-acetylacetonate, gallium-acetylacetonate, and indium-acetylacetonate, aluminum-(picolymethylketone)-bis{2,6-di(t-butyl)phenoxide}, scandium-(4-methoxy-picolylmethlketone)-bis(acetylacetonate), and mixtures thereof.

11. The light-emitting device of claim 1, wherein organic EL elements of the same stack emit different light colors.

12. The light-emitting device of claim 1, wherein organic EL elements that are electrically connected in series comprise the same organic EL material.

13. The light-emitting device of claim 1, wherein each series of organic EL elements is activated with a different voltage level.

* * * * *